(12) United States Patent
Kitamura (10) Patent No.: US 6,809,376 B2
(45) Date of Patent: Oct. 26, 2004

(54) SEMICONDUCTOR INTEGRATED CIRCUIT DEVICE AND MANUFACTURE METHOD THEREFORE

(75) Inventor: Akio Kitamura, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/055,717

(22) Filed: Jan. 23, 2002

(65) Prior Publication Data

US 2002/0117713 A1 Aug. 29, 2002

(30) Foreign Application Priority Data

Jan. 23, 2001 (JP) ........................................ 2001-015043

(51) Int. Cl.[7] .............................................. H01L 29/76
(52) U.S. Cl. ........................ 257/336; 257/335; 438/301
(58) Field of Search ................................ 257/335, 336, 257/327, 305; 438/301, 306

(56) References Cited

U.S. PATENT DOCUMENTS 5,780,907 A  *  7/1998 Ema et al. ................... 257/371

FOREIGN PATENT DOCUMENTS

| JP | 7-183390 | 7/1995 |
|----|----------|--------|
| JP | 11-233769 | 8/1999 |
| JP | 2000-91574 | 3/2000 |

* cited by examiner

*Primary Examiner*—Richard Elms
*Assistant Examiner*—Brad Smith
(74) *Attorney, Agent, or Firm*—Rossi & Associates (57) ABSTRACT

Elements in a triple-well MOS transistor are prevented from being destroyed due to an increase in current consumption or a thermal runaway of a parasitic bipolar transistor. A triple-well NMOS transistor comprising a P well area formed within an N well area and a MOSFET formed in the P well area, an impurity-diffused area having a lower impurity concentration than an N+ drain area is formed close to the N+ drain area, thereby restraining substrate current. The impurity concentration of the P well area is increased to reduce the current gain of a parasitic bipolar transistor. To further reduce the current gain, a punch-through stopper area may be formed. The impurity concentration of the impurity-diffused area is set to equal that of an N− LDD area 31 of a fine CMOS device integrated on the same substrate 1. These areas are formed during a single ion injection step.

11 Claims, 10 Drawing Sheets

SEMICONDUCTOR INTEGRATED CIRCUIT DEVICE AND MANUFACTURE METHOD THEREFORE

FIELD OF THE INVENTION

The present invention relates to a semiconductor integrated circuit device and a manufacture method therefor, and in particular, to a semiconductor integrated circuit device comprising a second-conductivity-type well area on a main surface of a first-conductivity-type semiconductor substrate and a MOSFET formed in a first-conductivity-type well area formed within the second-conductivity-type well area.

BACKGROUND

The well-known triple-well NMOS transistor has an N-type well area formed on a main surface of a P-type semiconductor substrate, a P-type well area further formed within the N-type well area, and an NMOSFET formed in the P-type well area (Japanese Patent Application Publication No. 7-78881). With the triple-well NMOS transistor, the potentials at a source and a well can be set to be equal, thereby avoiding a back gate bias. Further, in the triple-well NMOS transistor, the NMOS transistor is formed in the P-type well within the N-type well, so that (for example), the N-type well can be set to have the highest potential, while the P-type well can be set to have a lower potential. Consequently, this transistor has the advantage of enabling the use of a negative voltage.

Japanese Patent Application Publication No. 11-233769 discloses a technique of restraining the occurrence of a punch-through phenomenon in a fine MOSFET by forming an impurity area (punch-through stopper area) deep below a gate electrode, the impurity area having a conductivity type opposite to that of a source and a drain. Furthermore, Japanese Patent Application Publication No. 2000-91574 discloses a technique of increasing a drain voltage resistance by forming an offset drain area between a drain area and a channel formed area, the offset drain area having the same conductivity type as the drain area and a lower impurity concentration than the drain area. Moreover, Japanese Patent Application Publication 7-183390 discloses a semiconductor device having a punch-through stopper area and an offset drain area.

However, in the above-described triple-well NMOS transistor, the N-type drain area, the P-type well area, and the N-type well area constitute a parasitic bipolar transistor, so that a parasitic current may flow that corresponds to the amount of injected charge, such as substrate current multiplied by current gain. Such parasitic current may have the adverse effect of increasing current consumption or causing a thermal runaway of the parasitic bipolar transistor, destroying the elements.

It would therefore be desirable to provide a semiconductor integrated circuit device comprising a MOS transistor having a triple-well structure, wherein substrate current can be restrained and the current gain of the parasitic bipolar transistor reduced to prevent an increase in current consumption and the destruction of elements resulting from a thermal runaway of the parasitic bipolar transistor.

It would further be desirable to provide a method of manufacturing a semiconductor integrated circuit device, which method can use as few steps as possible to manufacture an integrated circuit device comprising a MOS transistor having a triple well structure and a conventional fine CMOS transistor formed in a single well, the MOS and CMOS transistors being provided on the same semiconductor substrate.

SUMMARY OF THE INVENTION

The present invention provides a semiconductor integrated circuit device comprising a triple-well transistor having a second-conductivity-type well area formed on a main surface of a first-conductivity-type semiconductor substrate, a first-conductivity-type well area further formed within the second-conductivity-type well area, and a MOSFET formed in the first-conductivity-type well area, wherein a drain area is formed apart from a gate electrode, and an impurity-diffused area having a lower impurity concentration than the drain area is formed between the drain area and a drain area side end of the gate electrode.

In the manufacture of this semiconductor integrated circuit device, the second-conductivity-type well area of the triple-well MOS transistor and a second-conductivity-type well area of a fine CMOS transistor are simultaneously formed. Further, the first-conductivity-type well area of the triple-well MOS transistor and a first-conductivity-type well area of the fine CMOS transistor may be simultaneously formed. Furthermore, if the fine CMOS transistor has an LDD area, this LDD area and said impurity-diffused area of the triple-well MOS transistor may be simultaneously formed.

According to the present invention, the impurity-diffused area having a lower impurity concentration than the drain area is formed on the drain side of the triple-well MOS transistor, thereby restraining the substrate current, which may lead to the flow of parasitic current from a parasitic bipolar transistor composed of the second-conductivity-type drain area, the first-conductivity-type well area, and the second-conductivity-type well area. Further, in the triple-well MOS transistor, the current gain of the parasitic bipolar transistor can be reduced by increasing the impurity concentration of the first-conductivity-type well area. Furthermore, an increase in the number of process steps can be minimized by simultaneously forming the impurity-diffused area of the triple-well MOS transistor and the LDD area of the fine CMOS device.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Figure 1:
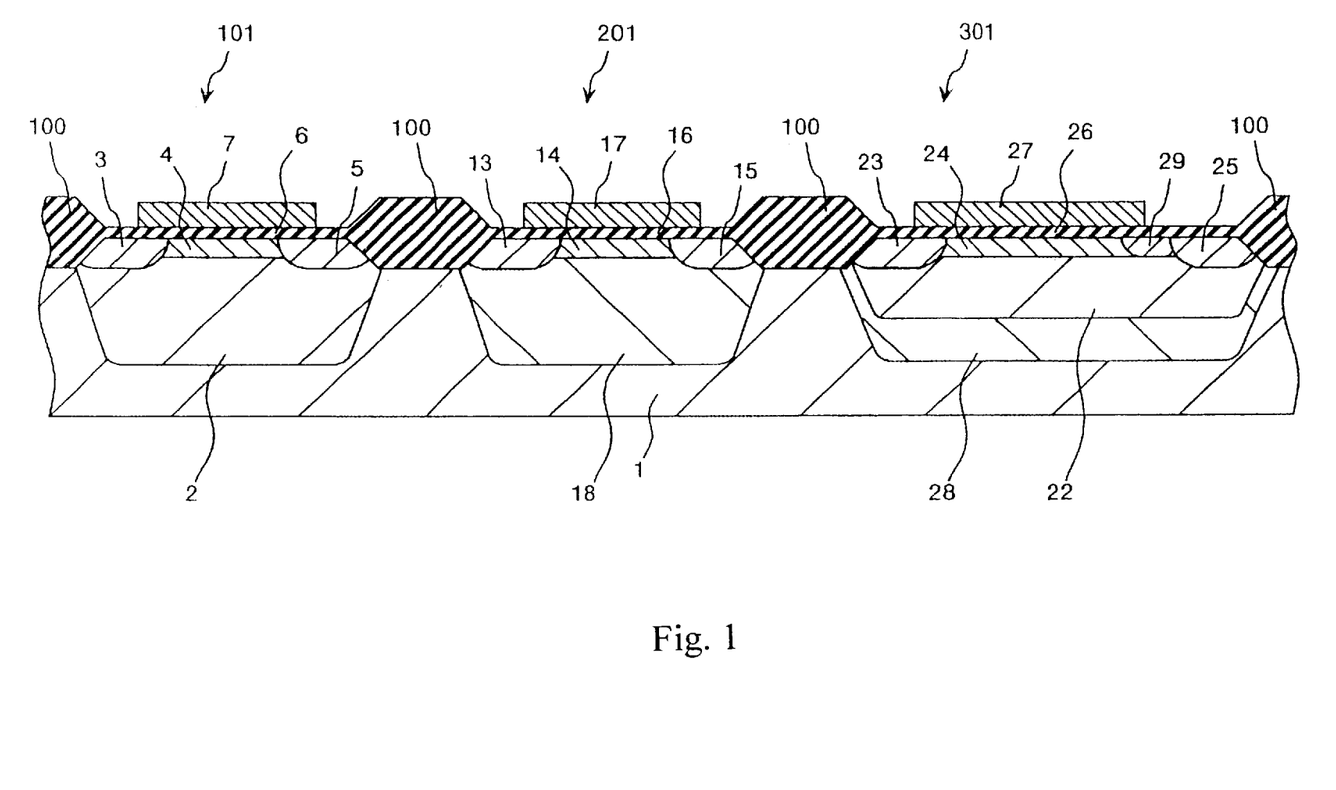
FIG. 1 is a vertical sectional view showing an essential part of a semiconductor integrated circuit device according to a first embodiment of the present invention.

FIG. 1 is a sectional view showing an essential part of a semiconductor integrated circuit device according to a first embodiment of the present invention. In this semiconductor integrated circuit device, an NMOS transistor 101 as a first MOS transistor, a PMOS transistor 201 as a second MOS transistor, and a triple-well NMOS transistor 301 as a third MOS transistor are formed on the same semiconductor substrate 1. The NMOS transistor 101 and the PMOS transistor 201 constitute a CMOS device.

However, this semiconductor substrate 1 has other elements formed thereon in an element formed area partitioned by a field oxide film, but these elements are omitted from FIG. 1 (this applies to the other figures). In the following description, a first conductivity type corresponds to a P type and a second conductivity type corresponds to an N type, but vice versa (this applies to the other embodiments).

The NMOS transistor 101 has a P-type well area (hereinafter referred to as a "P well area") 2 formed on a main surface of a P-type semiconductor substrate (hereinafter referred to as a "P substrate") 1 and in an element formed area surrounded by a field oxide film 100 provided on the main surface of the P substrate 1. An N$^+$ source area 3, a P$^-$ channel formed area 4, and an N$^+$ drain area 5 are formed in the P well area 2 on the main surface of the P substrate 1. Further, a gate electrode 7 is formed on the P$^-$ channel formed area 4 via a gate insulated film 6.

The PMOS transistor 201 comprises an N-type well area (hereinafter referred to as an "N well area") formed on the main surface of the P substrate 1 and in the element formed area surrounded by the field oxide film 100 provided on the main surface of the P substrate 1. A P$^+$ source area 13, an N$^-$ channel formed area 14, and a P$^+$ drain area 15 are formed in the N well area 18 and on the main surface of the P substrate 1. Further, a gate electrode 17 is formed on the N$^-$ channel formed area 14 via a gate insulated film 16.

The triple-well NMOS transistor 301 has an N well area 28 formed on the main surface of the P substrate 1 and in the element formed area surrounded by the field oxide film 100 provided on the main surface of the P substrate 1. A P well area 22 is formed in the N well area 28 and on the main surface of the P substrate 1. The P well area 22 has a surface concentration of about $0.75 \times 10^{17}$ to 1.25 to $10^{17}$/cm$^3$. An N$^+$ source area 23, a P$^-$ channel formed area 24, and an N$^+$ drain area 25 are formed in the P well area 22 and on the main surface of the P substrate 1. Further, a gate electrode 27 is formed on the P$^-$ channel formed area 24 via a gate insulated film 26.

The N$^+$ drain area 25 is located, for example, 0.5 $\mu$m or greater distance from the drain side end of the gate electrode 27. An impurity-diffused area 29 having a lower concentration of N-type impurities than the N$^+$ drain area 25 is formed between the drain side end of the gate electrode 27 and the N$^+$ drain area 25. The impurity-diffused area 29 has an xj of about 0.3 $\mu$m and a surface concentration of about $5 \times 10^{16}$ to $1 \times 10^{18}$/cm$^3$. Accordingly, the impurity-diffused area 29 functions as an N$^-$ offset drain area, which reduces electric fields at the drain side end of the gate electrode 27, thereby contributing to restraining the generation of hot electrons in an on state.

Although not shown, a conductive portion, wires, a passivation film, and other parts constituting source and drain electrodes are laminated on the MOS transistors on the main surface of the P substrate 1 and on other elements (not shown).

Figure 2:
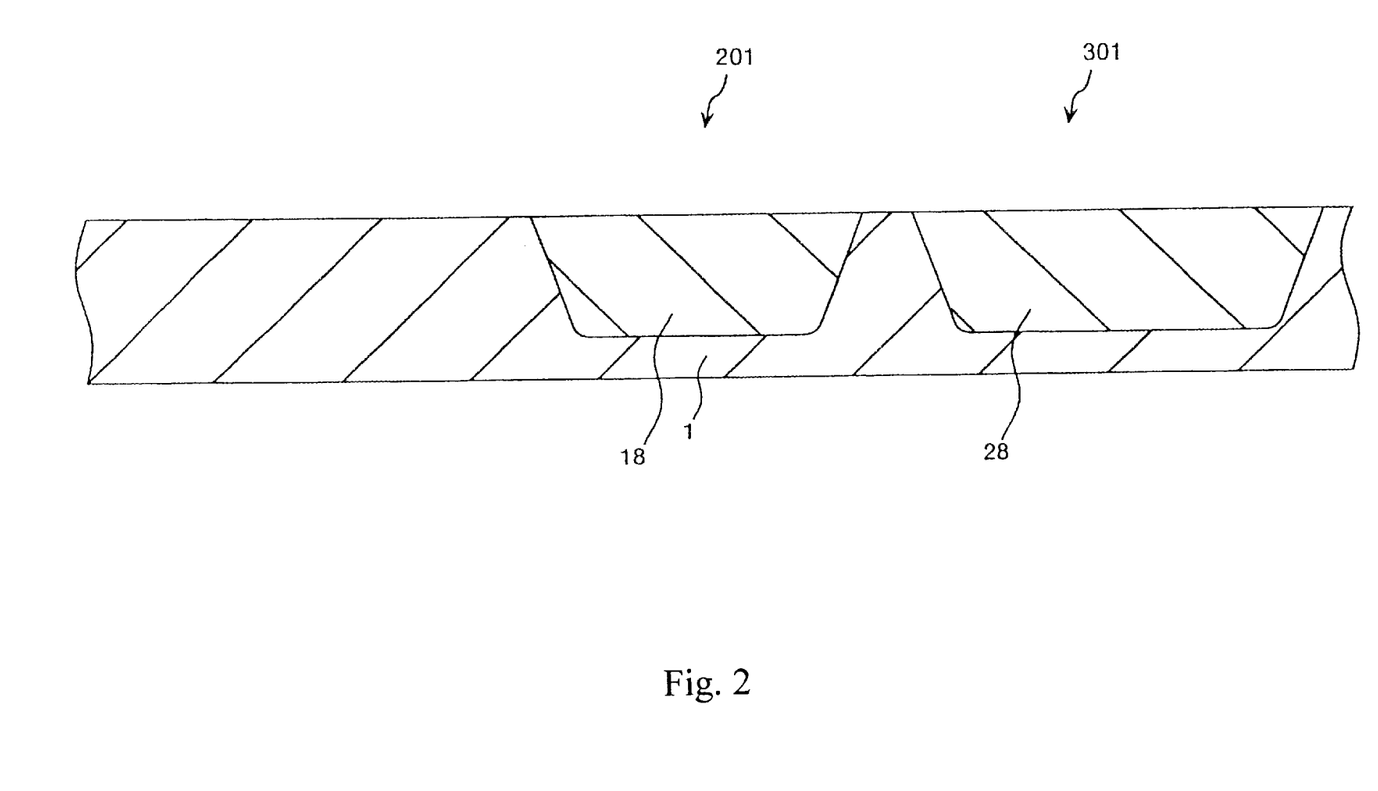
FIG. 2 is a vertical sectional view showing an essential part of the semiconductor integrated circuit device according to the first embodiment of the present invention, which is in its manufacturing stage.
Figure 3:
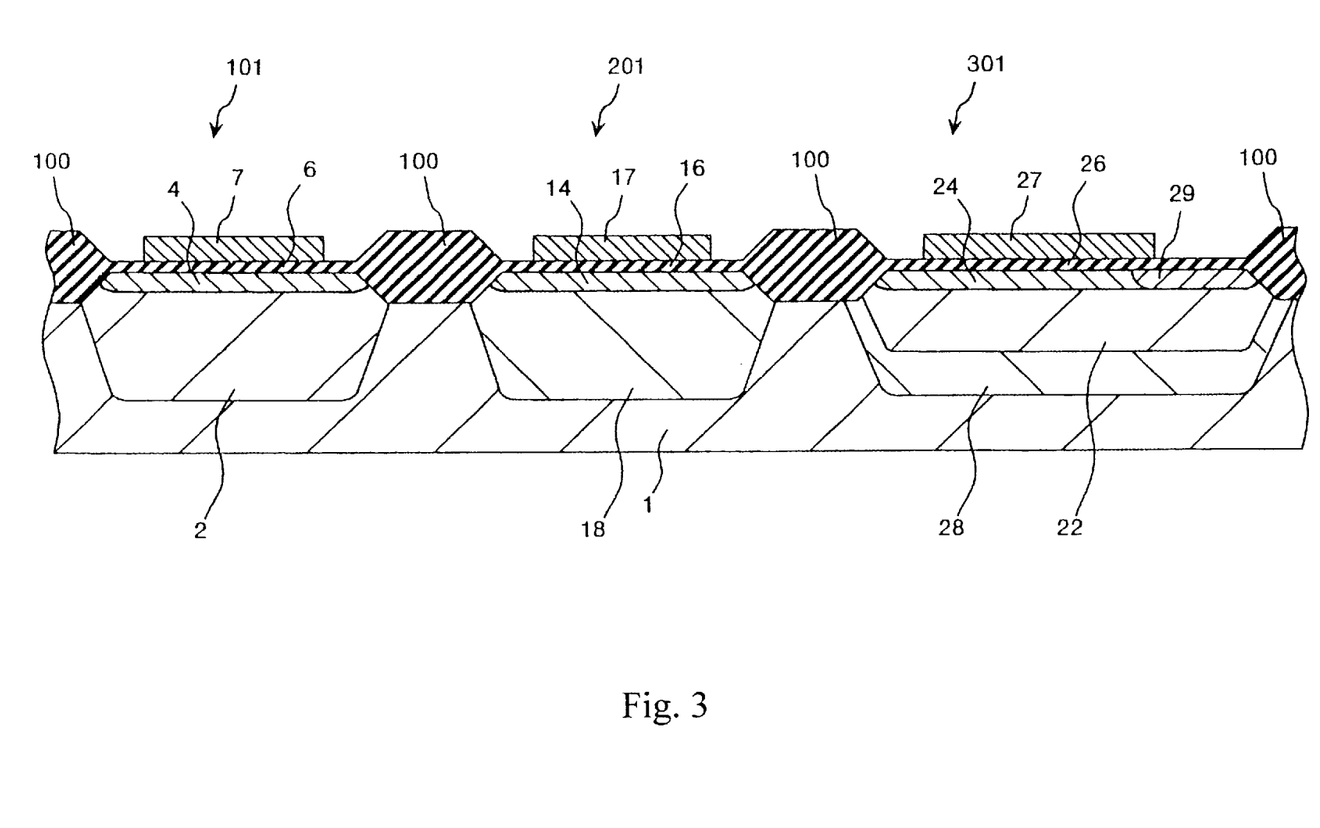
FIG. 3 is a vertical sectional view showing an essential part of the semiconductor integrated circuit device according to the first embodiment of the present invention, which is in its manufacturing stage.

Now, a process of manufacturing a semiconductor integrated circuit device according to The first embodiment will be described. FIGS. 2 and 3 are vertical sectional views showing essential parts of the semiconductor integrated circuit device according to The first embodiment, which is in its manufacturing stage. First, as shown in FIG. 2, the N well areas 18 and 28 are formed in the areas in which the PMOS transistor 201 and the triple-well NMOS transistor 301 are formed and on the main surface of the P substrate 1 by an ion injection method. The N well areas 18 and 28 can be formed in a single area without separation.

Subsequently, as shown in FIG. 3, the P well area 2 is formed in the area in which the NMOS transistor 101 is formed and on the main surface of the P substrate 1 by the ion injection method. Further, the P well area 22 is formed in the N well area 28 and on the main surface of the P substrate 1 by the ion injection method. At this time, the P well area 22 is formed simultaneously with the P well area 2. Subsequently, the field oxide film 100, the P$^-$ channel formed areas 4 and 24, the N$^-$ channel formed area 14, the gate insulated films 6, 16, and 26, and the gate electrodes 7, 17, and 27 are formed using a well-known method.

Subsequently, the impurity diffusion area 29 as an N$^-$ offset drain area is formed only on the drain side of the gate electrode 27 by the ion injection method, on the basis of a self-alignment process that uses the gate electrode 27 as a mask, while using a mask (not shown) having a window pattern corresponding to the drain side portion of the triple-well NMOS transistor 301. This state is shown in FIG. 3.

Subsequently, the N$^+$ source areas 3 and 23 and the N$^+$ drain area 5 are formed by the ion injection method on the basis of the self-alignment process using the gate electrodes 7 and 27 as a mask. In this case, the N$^+$ drain area 25 is simultaneously formed using a mask (not shown) having a window pattern corresponding to the area of the triple-well NMOS transistor 301 in which the N$^+$ drain area 25 is formed. That is, the N$^+$ drain area 25 is not formed on the basis of the self-alignment process using the gate electrode 27 as a mask, but at the location defined by the mask. Subsequently, the P$^+$ source area 13 and the P$^+$ drain area 15 are formed by the ion injection method on the basis of a self-alignment process using the gate electrodes 17 as masks. The impurity-diffused areas including the area 29 are activated by thermal treatment. This state is shown in FIG. 1.

Subsequently, although not shown, an interlayer insulated film is laminated all over the substrate, and contact holes are then opened therein. Then, a conductive portion, wires, a passivation film, and other parts constituting source and drain electrodes are formed to complete a semiconductor integrated circuit device.

According to the first embodiment, described above, the impurity-diffused area 29, having a low concentration, is formed in the triple-well NMOS transistor 301, so that electric fields at the drain side end of the gate electrode 27 are reduced to restrain the substrate current, which may lead to the flow of parasitic current from a parasitic bipolar transistor composed of the N$^+$ drain area 25, the P well area 22, and the N well area 28. Specifically, substrate current can be reduced to about one-tenths to one-thousandth that in the NMOS transistor 101. Further, since the P well area 22 has a high impurity concentration, the current gain of the parasitic bipolar transistor decreases. Consequently, inappropriate operations caused by the malfunctioning of the parasitic bipolar transistor are prevented.

Figure 4:
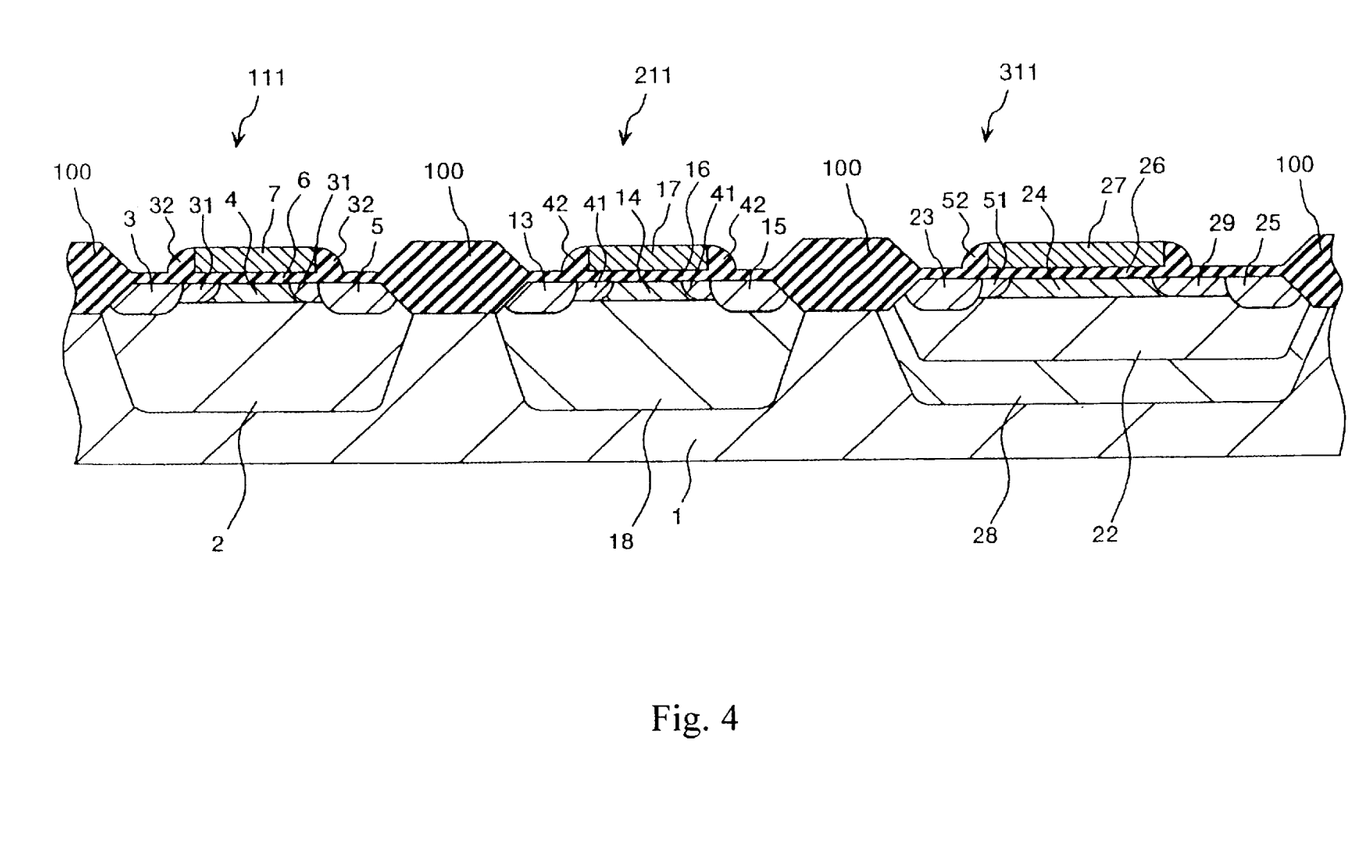
FIG. 4 is a vertical sectional view showing an essential part of a semiconductor integrated circuit device according to a second embodiment of the present invention.

FIG. 4 is a vertical sectional view showing an essential part of a semiconductor integrated circuit according to a second embodiment of the present invention. The second embodiment is the semiconductor integrated circuit device of the first embodiment, to which LDD areas 31, 41, and 51 and spacer oxide films 32, 42, and 52 have been added. Since the other arrangements are the same as those of the first embodiment, the same arrangements as those of the first embodiment are denoted by the same reference numerals, and the description thereof is omitted.

In the P well area 2 of the NMOS transistor 111 as a first MOS transistor and on the main surface of the P substrate 1, the N$^-$ LDD areas 31 are formed between the source side end of the gate electrode 7 and the N$^+$ source area 3 and between the drain side end of the gate electrode 7 and the N drain area 5. The N$^-$ LDD area 31 has a surface concentration of about $5 \times 10^{17}$ to $1 \times 10^{18}$/cm$^3$, which is lower than that of the source and drain areas 3 and 5. The spacer oxide film 32 is formed at the sides of the gate electrode 7.

In the N well area 18 of the PMOS transistor 211 as a second MOS transistor and on the main surface of the P substrate 1, the P$^-$ LDD areas 41 are formed between the source side end of the gate electrode 17 and the P$^+$ source area 13 and between the drain side end of the gate electrode 17 and the P$^+$ drain area 15. The P-LDD area 41 has a surface concentration of about $5 \times 10^{17}$ to $1 \times 10^{18}$/cm$^3$, which is lower than that of the source and drain areas 13 and 15. The spacer oxide film 42 is formed at the sides of the gate electrode 17.

In the P well area 22 of the triple-well NMOS transistor 311 as a third MOS transistor and on the main surface of the P substrate 1, the N-LDD area 51 is formed between the source side end of the gate electrode 27 and the N$^+$ source area 23. The N$^-$LDD area 51 has a surface concentration of about $5 \times 10^{17}$ to $1 \times 10^{18}$/cm$^3$, which is lower than that of the source and drain areas 23 and 25. The spacer oxide film 52 is formed at the sides of the gate electrode 27. In the second embodiment, with a first manufacture method, described below, the impurity-diffused area 29 has a surface concentration of about $5 \times 10^{16}$ to $1 \times 10^{18}$/cm$^3$, whereas with a second manufacture method, described below, it has a surface concentration of about $5 \times 10^{17}$ to $1 \times 10^{18}$/cm$^3$, which is the same as that of the N$^-$LDD area 51.

Figure 5:
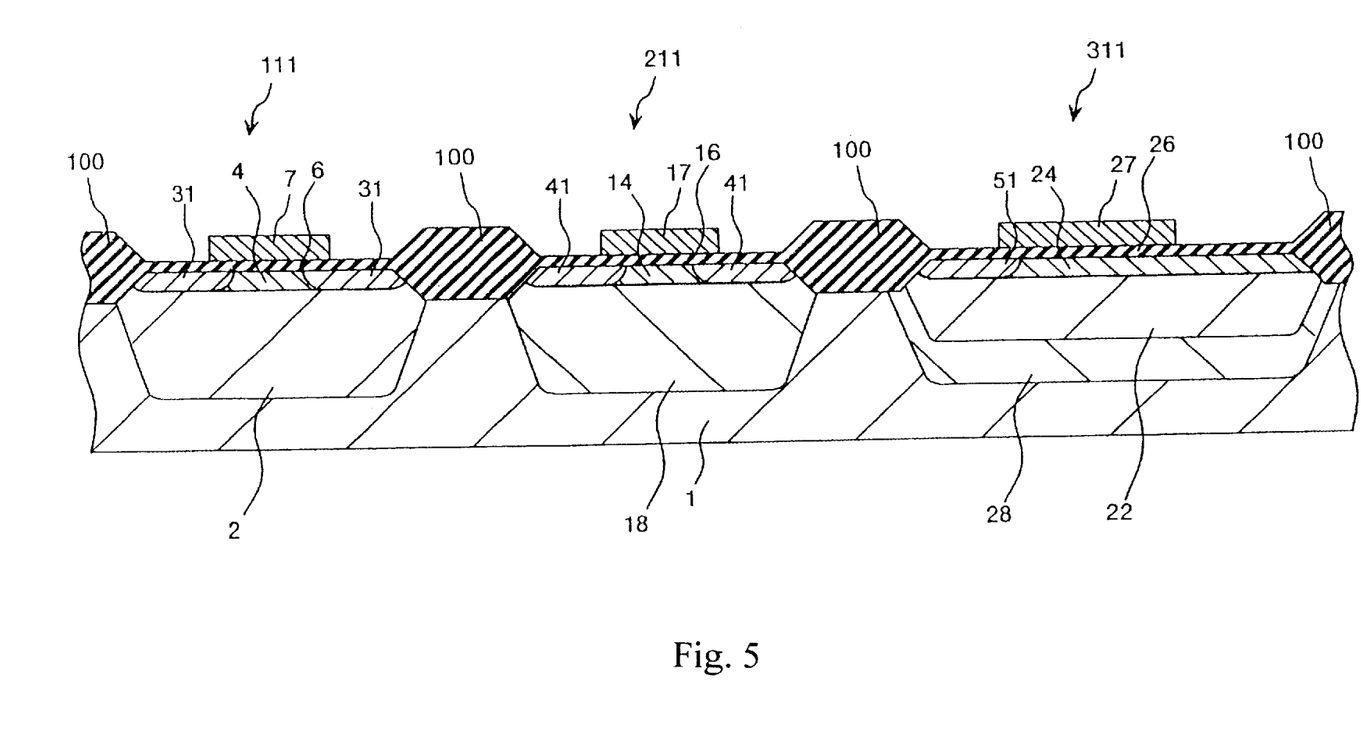
FIG. 5 is a vertical sectional view showing an essential part of the semiconductor integrated circuit device according to the second embodiment of the present invention, which is being manufactured using a first manufacture method.
Figure 6:
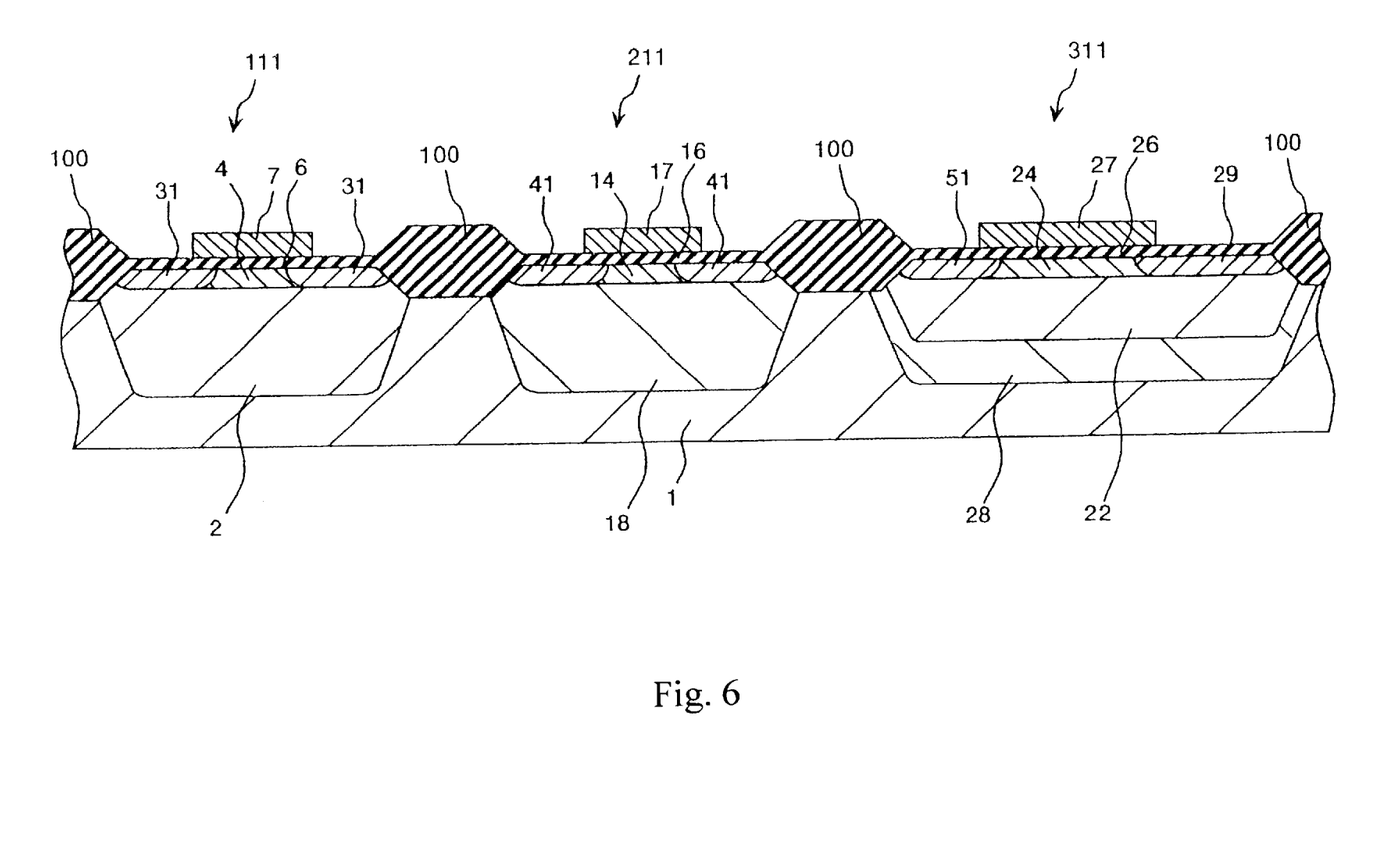
FIG. 6 is a vertical sectional view showing an essential part of the semiconductor integrated circuit device according to the second embodiment of the present invention, which is being manufactured using the first manufacture method.

Now, a process of manufacturing a semiconductor integrated circuit device according to the second embodiment will be described. First, a first manufacture method will be described. FIGS. 5 and 6 are vertical sectional views showing essential parts of the semiconductor integrated circuit device according to The second embodiment, which is being manufactured by the first manufacture method. First, the N well areas 18 and 28, the P well areas 2 and 22, the field oxide film 100, the P-channel formed areas 4 and 24, the N-channel formed area 14, the gate insulated films 6, 16, and 26, and the gate electrodes 7, 17, and 27 are sequentially formed, as in the case with the first embodiment.

Then, the N$^-$ LDD area 31 is formed by the ion injection method on the basis of a self-alignment process using the gate electrodes 7 of the NMOS transistor 111 as a mask. At the same time, the N$^-$ LDD area 51 is formed close to the source side of the gate electrode 27 by the ion injection method on the basis of a self-alignment process using the gate electrodes 27 of the triple-well NMOS transistor 311 as a mask. At this time, the drain side of the gate electrode 27 is masked so that no impurities are injected into the drain side of the gate electrode 27. Further, the P$^-$ LDD area 41 is formed by the ion injection method on the basis of a self-alignment process using the gate electrodes 17 as a mask. This state is shown in FIG. 5.

Subsequently, as in the case with the first embodiment, the impurity diffusion area 29 as an N$^-$ offset drain area is formed only on the drain side of the gate electrode 27 of the triple-well NMOS transistor 311 by the ion injection method. This state is shown in FIG. 6.

Subsequently, the spacer oxide films 32, 42, and 52 are formed. The N$^+$ source areas 3 and 23 and the N$^+$ drain area 5 are formed by the ion injection method on the basis of a self-alignment process using the spacer oxide films 32 and 52 as a mask. At the same time, as in the case with the first embodiment, the N$^+$ drain area 25 is formed away from the gate electrode 27 using a mask (not shown) having a window pattern corresponding to the an area of the triple-well NMOS transistor 311 in which the N$^+$ drain area 25 is formed.

Further, the P$^+$ source area 13 and the P$^+$ drain area 15 are formed by the ion injection method on the basis of a self-alignment process using the spacer oxide film 42 as a mask. The impurity-diffused areas including the area 29 are activated by thermal treatment. This state is shown in FIG. 4.

Subsequently, although not shown, the lamination of an interlayer insulated film, the opening of contact holes, and the formation of a conductive portion, wires, a passivation film, and other parts constituting source and drain electrodes are carried out as in the case with the first embodiment to complete a semiconductor integrated circuit device.

Figure 7:
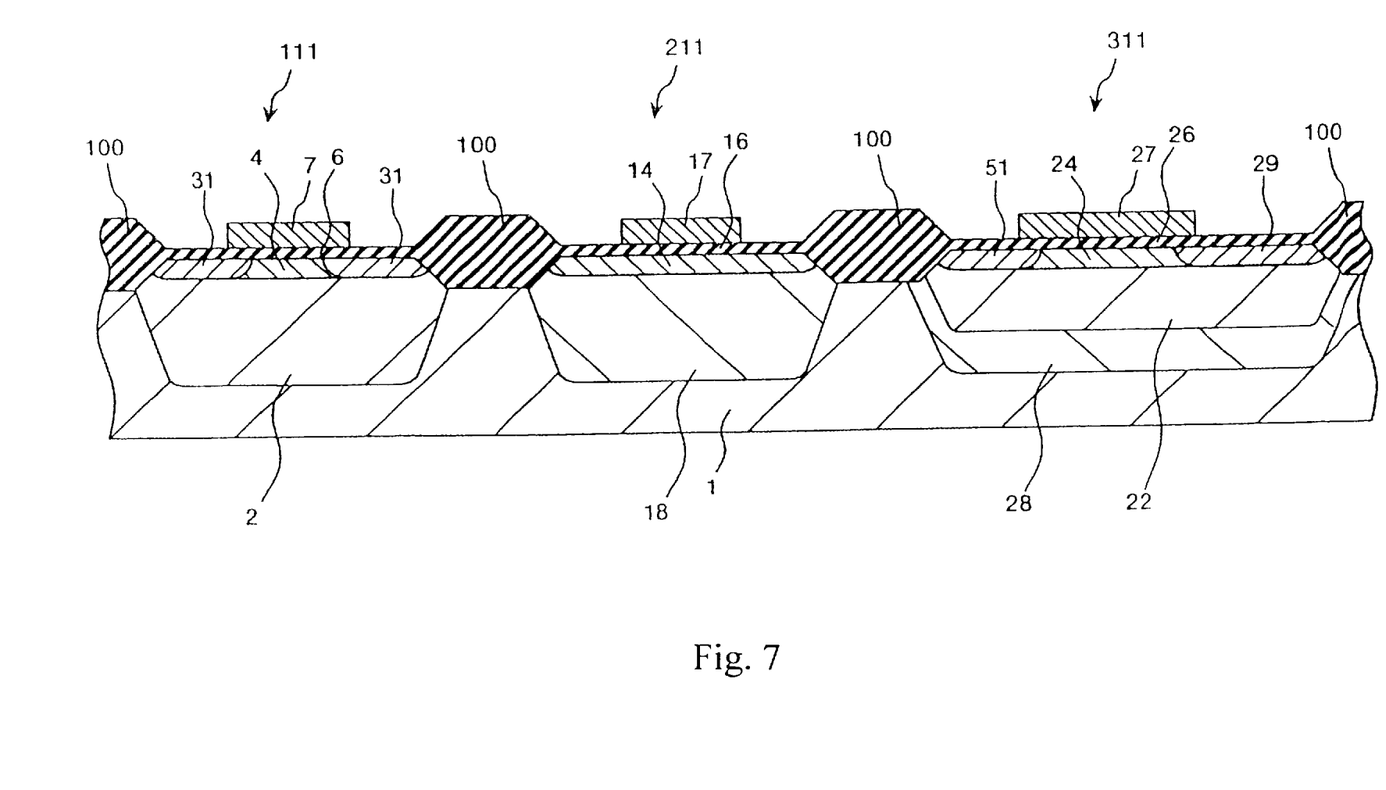
FIG. 7 is a vertical sectional view showing an essential part of the semiconductor integrated circuit device according to the second embodiment of the present invention, which is being manufactured using the second manufacture method.

Next, a second method of manufacturing a semiconductor integrated circuit device according to the second embodiment will be described. FIG. 7 is a vertical sectional view showing an essential part of the semiconductor integrated circuit device, which is being manufactured using the second manufacture method. The second manufacture method is the same as the first one, except for the step of forming the LDD areas 31, 41, and 51 and the subsequent steps. With the second manufacture method, during the formation of the N$^-$ LDD area 31 of the NMOS transistor 111 and the N$^-$ LDD area 51 of the triple-well NMOS transistor 311, the impurity-diffused area 29 is also formed by injecting impurities into the drain side of the gate electrode 27. This eliminates the necessity of a mask for forming an offset drain area (impurity-diffused area 29) used in the above-described first manufacture method. This state is shown in FIG. 7. The subsequent steps are the same as those of the above-described first manufacture method.

According to the second embodiment, described above, the impurity-diffused area 29, having a low concentration, is formed in the triple-well NMOS transistor 311, thereby reducing electric fields at the drain side end of the gate electrode 27. Consequently, as in the case with the second embodiment, substrate current, which may lead to the flow of parasitic current from a parasitic bipolar transistor in the triple-well NMOS transistor 311, can be reduced to about one-tenths to one-thousandth that in the NMOS transistor 111. Further, since the P well area 22 has a high impurity concentration, the current gain of the parasitic bipolar transistor decreases. Therefore, inappropriate operations caused by the malfunctioning of the parasitic bipolar transistor are prevented.

Further, according to the second manufacture method of the second embodiment, described above, the impurity-diffused area 29 is formed together with the N⁻ LDD areas 31 and 51, thereby reducing the number of masks used and thus the number of process steps to simplify the process.

Figure 8:
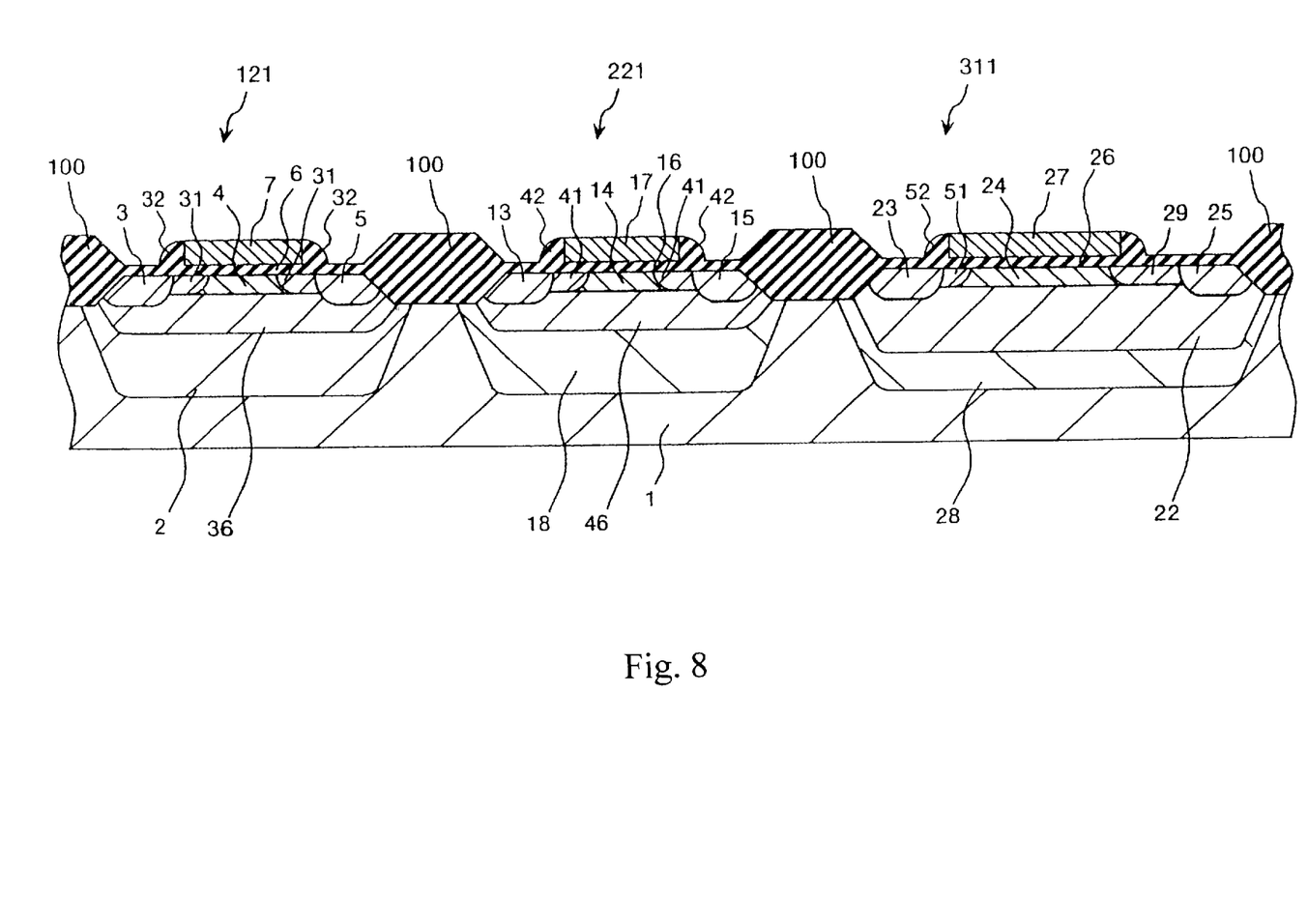
FIG. 8 is a vertical sectional view showing an essential part of a semiconductor integrated circuit device according to a third embodiment of the present invention.

FIG. 8 is a vertical sectional view showing an essential part of a semiconductor integrated circuit device according to a third embodiment of the present invention. The third embodiment is the semiconductor integrated circuit device of the second embodiment (see FIG. 4), in which a P⁻ punch-through stopper area 36 and an N⁻ punch-through stopper area 46 are added to an NMOS transistor 121 as a first MOS transistor and a PMOS transistor 221 as a second MOS transistor, respectively, to restrain a punch-through phenomenon that may occur between the source areas 3 and 13 and the drain areas 5 and 15, respectively. The P punch-through stopper areas 36 has a higher impurity concentration than the P well area 2 and the N well area 18.

The NMOS transistor 121 and the PMOS transistor 221 constitute a submicron CMOS device having a channel length shorter than 1 μm. Since the other arrangements are the same as those of the first embodiment or 2, the same arrangements as those of the first embodiment or 2 are denoted by the same reference numerals, and the description thereof is omitted.

The P⁻ punch-through stopper area 36 and the N⁻ punch-through stopper area 46 are formed by the ion injection method after the P well area 22 of the triple-well NMOS transistor 311 as a third MOS transistor has been formed and before the field oxide film 100 is formed. At this time, the triple-well NMOS transistor 311 is masked. This manufacture process is the same as that of the second embodiment except that the step of forming the punch-through stopper areas 36 and 46 is inserted in this manner. Consequently, the formation of the impurity-diffused area 29 may be carried out simultaneously with the formation of the N⁻ LDD areas 31 and 51, or after it as a separate step.

According to the third embodiment, described above, the substrate current can be reduced to about one-tenths to one-thousandth that in the NMOS transistor 121, and the current gain of the parasitic bipolar transistor decreases, thereby preventing inappropriate operations caused by the malfunctioning of the parasitic bipolar transistor, as in the case with the second embodiment. Furthermore, the triple-well MOS transistor can be integrated on the same semiconductor substrate with a fine CMOS device.

Figure 9:
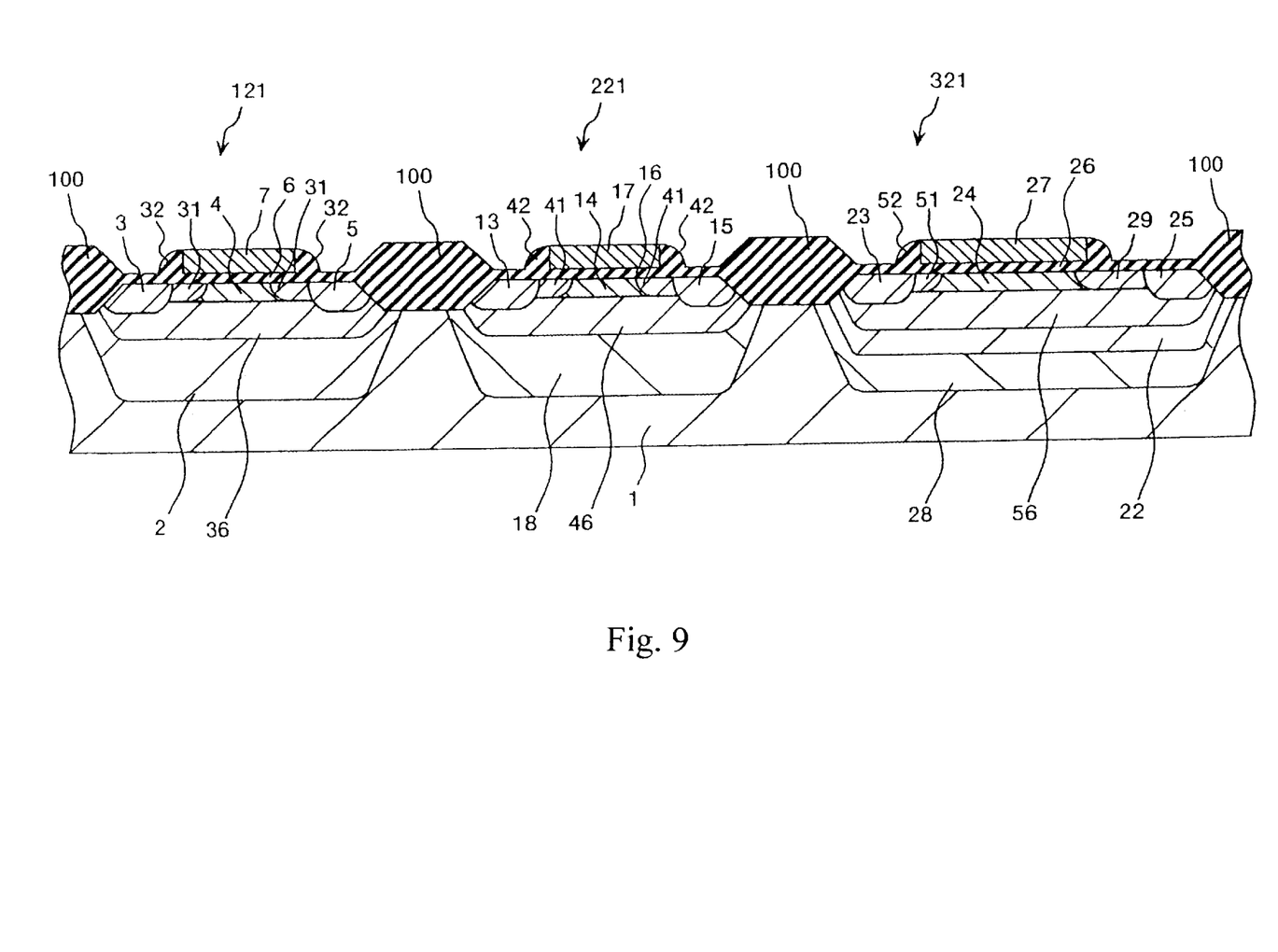
FIG. 9 is a vertical sectional view showing an essential part of a semiconductor integrated circuit device according to a fourth embodiment of the present invention.

FIG. 9 is a vertical sectional view showing an essential part of a semiconductor integrated circuit device according to a fourth embodiment of the present invention. The fourth embodiment is the semiconductor integrated circuit device of the third embodiment, in which the triple NMOS transistor 321 as a third MOS transistor also has a P⁻ punch-through stopper area 56 formed therein, having depth of 1 μm. The P⁻ punch-through stopper area 56 is formed together with the P⁻ punch-through stopper area 36 of the NMOS transistor 121. Thus, the manufacture process is similar to that of the third embodiment. Duplicate descriptions are omitted.

According to a fourth embodiment, described above, the substrate current can be reduced to about one-tenths to one-thousandth that in the NMOS transistor 121, and the current gain of the parasitic bipolar transistor decreases, as with The third embodiment. Furthermore, with the P⁻ punch-through stopper area 56, the current gain of a parasitic bipolar transistor composed of the N+ drain area 25, the P well area 22, the P⁻ punch-through stopper area 56, and the N well area 28 can be reduced to 50 or less. Consequently, inappropriate operations caused by the malfunctioning of the parasitic bipolar transistor are prevented.

Figure 10:
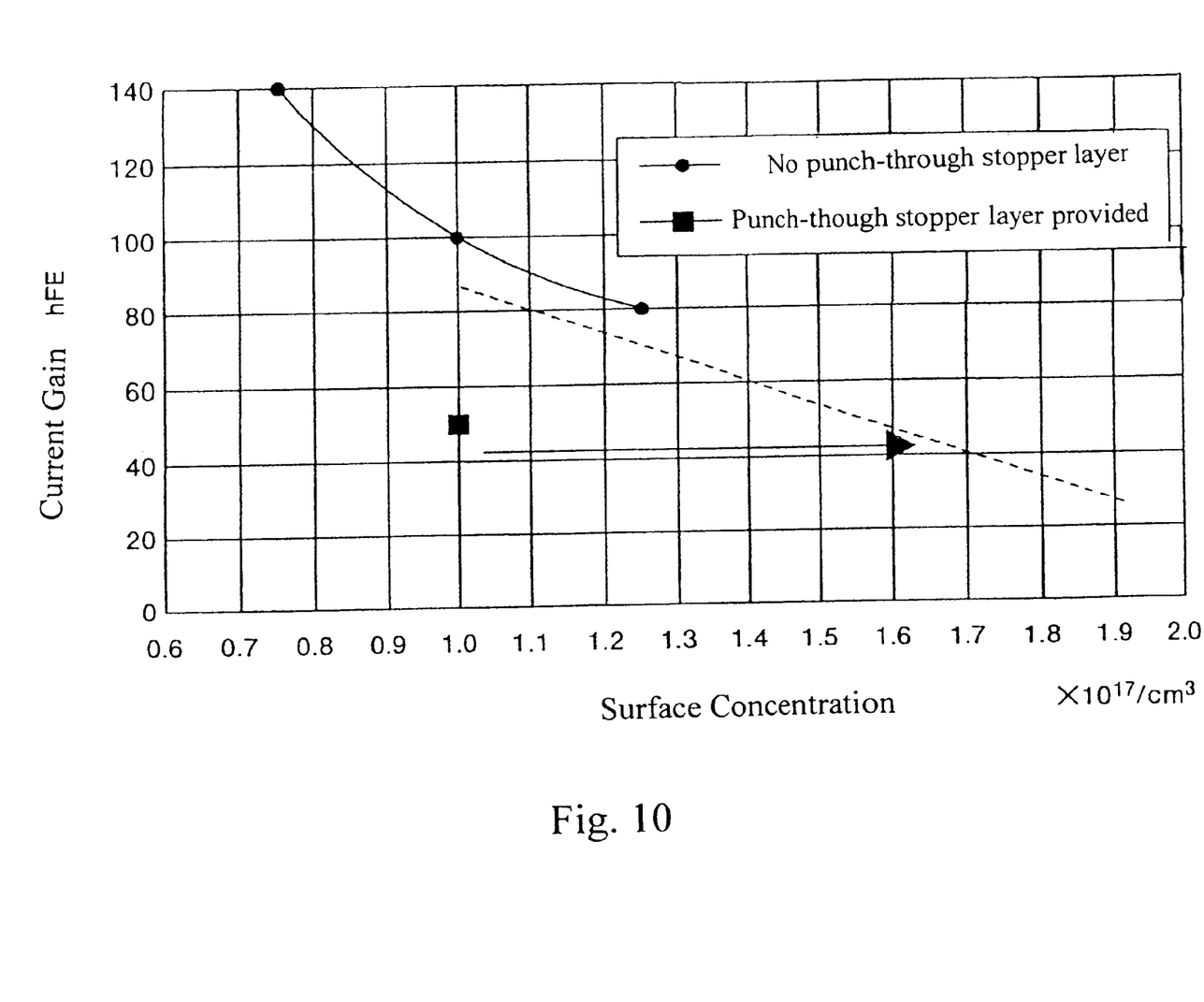
FIG. 10 is a characteristic diagram showing the relationship between the current gain of a parasitic bipolar transistor and the surface concentration of a P well area for the semiconductor integrated circuit device according to the fourth embodiment of the present invention.

Specifically, as shown in FIG. 10, with the P⁻ punch-through stopper area 56 (The fourth embodiment), the current gain is 50 when the P well area 22 has a surface concentration of $1\times10^{17}/cm^3$. In contrast, without the P⁻ punch-through stopper area 56 (Embodiments 1 to 3), the current gain is 140 when the P well area 22 has a surface concentration of $0.75\times10^{17}/cm^3$, 100 when the P⁻ well area 22 has a surface concentration of $1\times10^{17}/cm^3$, and 80 when the P well area 22 has a surface concentration of $1.25\times10^{17}/cm^3$. On the basis of the tendency observed when the P⁻ punch-through stopper area 56 is not formed, that is, a decrease in the current gain consistent with an increase in the surface concentration of the P well area 22, it is easily assumed that with the P⁻ punch-through stopper area 56, the current gain can be reduced to 50 or less by setting the surface concentration of the P well area 22 higher than $1\times10^{17}/cm^3$.

Further, according to the fourth embodiment, described above, the P-punch-through stopper area 56, having a depth of 1 μm, serves to compensate for an N-type semiconductor layer that may be formed on the surface of the P well area 22 of the triple-well NMOS transistor 321 after the formation of the P⁻well area 22. This N-type semiconductor layer is formed because the pileup of phosphorous on the surface of the N well area 28 is facilitated by the consistent increase in the concentration of impurities in the N well area 28 with the miniaturization of the transistor according to a scaling rule.

The present invention, described above, is not restricted to the above-described embodiments and the constructions shown in the accompanying drawings. For example, similar effects are obtained when the first conductivity type corresponds to the N type, while the second conductivity type corresponds to the P type.

According to the present invention, a triple-well MOS transistor has a second-conductivity-type impurity-diffused area having a lower impurity concentration than a second-conductivity-type drain area, thereby restraining substrate current, which may lead to the flow of parasitic current from a parasitic bipolar transistor composed of a drain area, a first-conductivity-type well area, and a second-conductivity-type well area. Further, since the first-conductivity-type well area has a high impurity concentration, the current gain of the parasitic bipolar transistor decreases. Consequently, inappropriate operations caused by the malfunctioning of the parasitic bipolar transistor are prevented.

What is claimed is:

1. A semiconductor integrated circuit device comprising:
   a semiconductor substrate;
   a first well area of a first-conductivity type formed in the semiconductor substrate;
   a second well area of a second-conductivity type well area formed in the semiconductor substrate;
   a third well area of the second-conductivity type formed in the semiconductor substrate;

a fourth well area of the first-conductivity tree formed in the third well area;

a first MOS transistor formed on the first well area;

a second MOS transistor formed on the second well area; and a third MOS transistor formed on the fourth well area and having a gate electrode, a second-conductivity-type drain area formed apart from the gate electrode and a second-conductivity-type impurity-diffused area formed between said drain area and a gate electrode end of said gate electrode, said second-conductivity-type impurity-diffused area having a lower impurity concentration than said drain area and connected to said drain area, wherein the impurity-diffused area prevents thermal runaway of a parasitic bipolar transistor formed by the drain area, the third well area and the fourth well area.

2. The semiconductor integrated circuit device according to claim 1, wherein said third MOS transistor includes a second-conductivity-type source area and a second-conductivity-type LDD area connected to the second-conductivity-type source area, and said first MOS transistor and said second MOS transistor each include a second-conductivity-type LDD area and a first-conductivity-type LDD area, respectively.

3. The semiconductor integrated circuit device according to claim 2, wherein an impurity concentration of said impurity-diffused area is the same as that of said LDD areas of said third MOS transistor and said first MOS transistor.

4. The semiconductor integrated circuit device according to any of claims 1 to 3, further including a punch-through stopper area that restrains occurrence of a punch-through phenomenon and has a higher impurity concentration than the first and second well areas formed in the first and second well areas.

5. The semiconductor integrated circuit device according to any of claims 1 to 3, further including a first-conductivity-type diffused area formed in the fourth well area having said third MOS transistor formed therein.

6. A method of manufacturing a semiconductor integrated circuit device comprising a semiconductor substrate, a first well area of a first-conductivity type formed in the semiconductor substrate, a second well area of a second-conductivity type well area formed in the semiconductor substrate, a third well area of the second-conductivity type formed in the semiconductor substrate, a fourth well area of the first-conductivity type formed in the third well area, a first MOS transistor formed on the first well area, a second MOS transistor formed on the second well area, and a third MOS transistor formed on the fourth well area, and the third MOS transistor having a gate electrode, a second conductivity-type drain area formed apart from the gate electrode, and a second-conductivity-type drain area formed apart from the gate electrode and a second-conductivity-type impurity-diffused area formed between said drain area and a gate electrode end of said gate electrode, said second-conductivity-type impurity-diffused area having a lower impurity concentration than said drain area and connected to said drain area, wherein the impurity-diffused areas prevents thermal runaway of a parasitic bipolar transistor formed by the drain area, the third well area, and the fourth well area, the method comprising the steps of:

simultaneously forming said second well area of said second MOS transistor and said third well area of said third MOS transistor on a main surface of said semiconductor substrate;

forming said first well area of said first MOS transistor on the main surface of said semiconductor substrate;

forming said fourth well area in said third well area of said third MOS transistor and on the main surface of said semiconductor substrate;

forming a gate insulated film and a gate electrode for each of said first MOS transistor, said second MOS transistor, and said third MOS transistor;

forming said impurity-diffused area having a lower impurity concentration than the drain area, in said fourth well area of said third MOS transistor and on the main surface of said semiconductor substrate, with a self-alignment process using said gate electrode as a mask;

simultaneously forming a source area of said first MOS transistor, a drain area of said first MOS transistor, a source area of said third MOS transistor, and said drain area of said third MOS transistor being formed apart from an end of said gate electrode and connected to said impurity-diffused area; and forming a source area and a drain area of said second MOS transistor.

7. The method of manufacturing a semiconductor integrated circuit device according to claim 6, further comprising the step of forming, in each of said first MOS transistor, said second MOS transistor, and said third MOS transistor, LDD areas on a source side and a drain sides of said first MOS transistor, on a source side and a drain sides of said second MOS transistor, and on a source side of said third MOS transistor, with a self-alignment process using said gate electrode as a mask, after said gate electrode has been formed and before said source area and said drain area are formed, the step being separate from formation of said impurity-diffused area.

8. The method of manufacturing a semiconductor integrated circuit device according to claim 6, further including the step of forming an LDD area on each of the source and drain sides of said first MOS transistor and the source side of said third MOS transistor.

9. The method of manufacturing a semiconductor integrated circuit device according to any of claims 6 to 8, wherein said first well area of said first MOS transistor and said fourth well area of said third MOS transistor are simultaneously formed.

10. The semiconductor integrated circuit device according to claim 1, wherein the third MOS transistor has a source area, the distance between the drain area of the third MOS transistor and the gate electrode thereof being greater than the distance between the source area of the third MOS transistor and the gate electrode thereof.

11. The semiconductor integrated circuit device according to claim 1, wherein the distance between the drain area of the third MOS transistor and the gate electrode thereof is 0.5 $\mu$m or greater.

* * * * *

UNITED STATES PATENT AND TRADEMARK OFFICE
CERTIFICATE OF CORRECTION

PATENT NO. : 6,809,376 B2
DATED : October 26, 2004
INVENTOR(S) : Akio Kitamura

It is certified that error appears in the above-identified patent and that said Letters Patent is hereby corrected as shown below:

<u>Title page, Item [54] and Column 1, line 1,</u>
Please delete the title and insert in place thereof -- SEMICONDUCTOR DEVICE WITH A TRIPLE WELL STRUCTURE AND MANUFACTURING METHOD THEREOF --

Signed and Sealed this

Twenty-eighth Day of December, 2004

JON W. DUDAS
*Director of the United States Patent and Trademark Office*